United States Patent
Okoronyanwu

(10) Patent No.: US 7,344,912 B1
(45) Date of Patent: Mar. 18, 2008

(54) METHOD FOR PATTERNING ELECTRICALLY CONDUCTING POLY(PHENYL ACETYLENE) AND POLY(DIPHENYL ACETYLENE)

(75) Inventor: Uzodinma Okoronyanwu, Clifton Park, NY (US)

(73) Assignee: Spansion LLC, Sunnyvale, CA (US)

( * ) Notice: Subject to any disclaimer, the term of this patent is extended or adjusted under 35 U.S.C. 154(b) by 436 days.

(21) Appl. No.: 11/069,181

(22) Filed: Mar. 1, 2005

(51) Int. Cl.
*H01L 21/00* (2006.01)
*H01L 21/16* (2006.01)
*H01L 21/44* (2006.01)
*H01L 21/4763* (2006.01)

(52) U.S. Cl. .................. 438/85; 438/104; 438/597; 438/637; 438/636; 257/E21.613

(58) Field of Classification Search .............. 438/706, 438/597, 623, 637, 652, 653, 99, 72, 800
See application file for complete search history.

(56) References Cited

U.S. PATENT DOCUMENTS

| | | | |
|---|---|---|---|
| 4,595,791 A * | 6/1986 | Basol et al. ............... | 136/256 |
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B2 | 7/2004 | Krieger et al. | |
| 6,770,905 B1 | 8/2004 | Buynoski et al. | |
| 6,773,954 B1 | 8/2004 | Subramanian et al. | |
| 6,781,868 B2 | 8/2004 | Bulovic et al. | |
| 6,787,458 B1 | 9/2004 | Tripsas et al. | |
| 6,803,267 B1 | 10/2004 | Subramanian et al. | |
| 6,825,060 B1 | 11/2004 | Lyons et al. | |
| 6,852,586 B1 | 2/2005 | Buynoski et al. | |
| 2003/0173612 A1* | 9/2003 | Krieger et al. ............ | 257/304 |

* cited by examiner

*Primary Examiner*—Scott B. Geyer
*Assistant Examiner*—Seahvosh Nikmanesh
(74) *Attorney, Agent, or Firm*—Amin, Turocy & Calvin, LLP

(57) ABSTRACT

Disclosed are methods of fabricating a memory cell structure. More specifically, a copper substrate, including but not limited to copper contacts and/or bit lines, can be formed within a metal-containing layer, for example. Optionally, one or more via openings can then be formed in an overlying dielectric layer to expose one or more of the copper contacts and/or bit lines. Copper sulfide material can be formed thereon. Alternatively, a portion of the exposed copper can be converted to copper sulfide (e.g., $Cu_2S_2$ or $Cu_2S$). The copper sulfide material can then be exposed to a vapor phase monomer to facilitate selective growth of a conducting polymer.

20 Claims, 6 Drawing Sheets

METHOD FOR PATTERNING ELECTRICALLY CONDUCTING POLY(PHENYL ACETYLENE) AND POLY(DIPHENYL ACETYLENE)

TECHNICAL FIELD

The present invention generally relates to processing a semiconductor substrate. In particular, the present invention relates to a novel process that facilitates forming conducting polymer derived from a substrate material.

BACKGROUND ART

The volume, use and complexity of computers and other electronic devices are persistently increasing. As computers continually become more powerful, new and improved electronic devices are continuously developed (e.g., digital audio players, video players). Additionally, the growth and use of digital media (e.g., digital audio, video, images, and the like) have further pushed development of these devices. This growth and development has vastly increased the amount of information desired/required to be stored and maintained for computer and electronic devices.

Memory devices generally include arrays of memory cells. Each memory cell can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid-state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as the size of inorganic solid-state devices decreases and integration increases, sensitivity to alignment tolerances increases making fabrication markedly more difficult. Formation of features at small minimum sizes does not imply that the minimum size can be used for fabrication of working circuits. It is necessary to have alignment tolerances, which are much smaller than the small minimum size, for example, one quarter the minimum size.

Scaling inorganic solid state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely. Furthermore, applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversible degradation of a semiconductor device.

Scaling and integration makes isolation in a monolithic semiconductor substrate more challenging. In particular, lateral isolation of devices from each other is difficult in some situations. Yet another difficulty is presented by the diffusion of carriers within the substrate; that is, free carriers can diffuse over many tens of microns and neutralize a stored charge. Thus, the limits with respect to additional device shrinkage and increasing densities may be approaching for inorganic memory devices. Furthermore, it is equally, if not more challenging, to achieve such device shrinkage for inorganic non-volatile memory devices while meeting increased performance demands and maintaining lower costs.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides a method of forming and patterning a conducting polymer such as during the fabrication of an organic memory cell. More specifically, a copper substrate including but not limited to copper contacts and/or bit lines can be formed within a metal-containing layer, for example. One or more via openings can then be formed in an overlying dielectric layer to expose one or more of the copper contacts and/or bit lines. A portion of the exposed copper can be converted to copper sulfide (e.g., CuS or Cu$_2$S). The copper sulfide material can then be selectively irradiated to facilitate selective growth of a conducting polymer. Exemplary ranges of wavelengths include but are not limited to 13.4 nm to 500 nm. It should be appreciated that other wavelengths can be employed to carry out actinic radiation exposure as described herein. The copper sulfide can also facilitate in the operation of the memory cell device since it is a conducting material. For example, the copper sulfide may operate as a passive layer employed to communicate and/or transmit information within and/or between one or more memory cells.

Following formation of the polymer in at least a portion of the via, a top electrode material may be deposited over the memory structure in order to fill any remaining portion of the via. Excess and/or unwanted portions of the top electrode material can be removed by polishing such as by a chemical mechanical polish (CMP) process. Thereafter, the via can have a lower portion comprising a polymer material and an upper portion comprising a top electrode material.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

Figure 1:
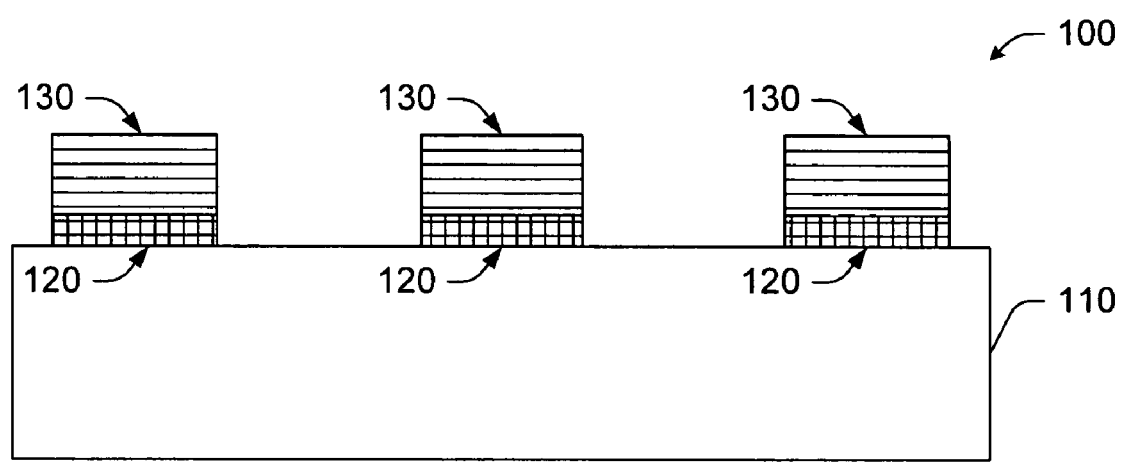
FIG. 1 illustrates a cross-sectional view of a partially fabricated, exemplary polymer memory device formed in accordance with an aspect of the present invention.

The present invention involves systems and methods that facilitate forming a conducting polymer using fewer masking steps than typically required under current schemes. The systems and methods include employing a copper substrate as in the form of a copper bit line and/or copper pad, exposing at least a portion of the copper (e.g. from the bit line and/or pad) in order to convert it to a catalytic material. Thus at least a portion of the catalytic material can be partially embedded within an upper portion of the copper bit line and/or pad. In practice, for example, at least a portion of the catalytic material can contact a portion of a polymer memory device such that the catalytic material forms a lower portion of the polymer memory device. This arrangement of the catalytic material facilitates access between at least one electrode and a polymer memory element.

Moreover, the catalytic material can constitute a passive region and can comprise at least one material that facilitates conductivity. One example of catalytic material is copper sulfide (e.g., $Cu_xS_y$, where x and y are integers greater than or equal to 1). More specifically, in a chamber having a gas phase monomer or polymer-precursor, a copper sulfide layer can be selectively exposed to radiation of an appropriate wavelength (or range of wavelengths such as from 13.4 nm to 500 nm) in the presence of oxygen. As a result, conducting polymer can be selectively grown on the part of the copper sulfide substrate that is subjected to the irradiation. Meanwhile, its growth can be selectively inhibited in regions which are masked from the irradiation. It should be appreciated that the catalytic material can comprise other materials and/or compounds depending on the configuration and type of structure desired. Examples include copper oxide and silver-copper-sulfide complex.

Conducting polymer growth can selectively take place such as in a portion of a via. Examples of programmable polymers which may be grown and/or formed and employed in the present invention include polyphenol acetylene, polyacetylene, poly-diphenyl acetylene, polyaniline, polythiophene, polyporphyrins, porphyrinic macrocycles, thiol derivatized polyporphyrins, polymetallocenes, polyferrocenes, polyphthalocyanines, polyvinylenes, polypyrroles, and poly-(p-phenylene vinylene, and/or combinations thereof, and/or monomers thereof.

Polymer growth and/or formation in the via may be terminated before the via is substantially filled with polymer material. The remaining or upper portion of the via can be filled with a top electrode material. For example, the top electrode material may be any one of tungsten, titanium, tantalum, titanium nitride, amorphous carbon, aluminum, indium-tin oxide, platinum, zinc, nickel, iron, manganese, magnesium, gold, chromium, metal silicides, alloys thereof, and/or any combination thereof. Exemplary alloys can be Hastelloy® (e.g., nickel-containing alloys), Kovar® (e.g., iron-containing alloys), Invar, Monel®, Inconel®, brass, stainless steel, magnesium-silver alloy, and various other alloys. Alternatively, polymer growth may extend beyond the via opening and later polished as desired.

Thereafter, an insulating layer and/or aluminum-containing word line may be formed over the via to substantially complete fabrication of a memory cell device. The word line may be at least partially composed of materials such as aluminum and/or other substances depending on the desired application.

The polymer memory device may be programmed by applying a voltage across the electrode material to establish impedance within the polymer memory device. The impedance represents one or more bits of information that is retained within the memory device. For example, after storing one or more bits of information, the voltage can be removed and the information remains stored within the polymer memory device. In addition, the polymer memory device does not require a refresh voltage to maintain the stored information.

To retrieve information stored within a polymer memory device, a current can be applied and following, the impedance stored in the memory device can be measured. Similar to programmed information, retrieved information from a memory element relates to one or more bits of information. The polymer memory device can have two states: a conductive "on" state or a non-conductive "off" state. In addition to these two states, polymer memory devices are capable of maintaining multiple of states contrary to conventional memory devices. More specifically, the polymer memory device can employ varying degrees of conductivity to identify additional states. For instance, the polymer memory device can exhibit a low impedance state including a very highly conductive state (e.g., very low impedance state), a highly conductive state (e.g., low impedance state), a conductive state (e.g., medium level impedance state), and a non-conductive state (e.g., very high impedance). Thus, multiple bits of information can be stored in a single polymer memory cell (e.g., 2 or more bits of information—4 states providing 2 bits of information, 8 states providing 3 bits of information, etc.).

The fabrication methods include forming a polymeric semiconductor as a layer and/or within a via in a layer and subsequently utilizing lithographic techniques to grow a conducting polymer. The fabrication methods can be employed to form one or more polymer memory devices serially and/or concurrently.

Growth of the conducting polymer as associated with forming a memory device in accordance with the present invention will now be described with respect to FIGS. 1-13 below.

FIG. 1 illustrates a partially fabricated memory cell structure 100 which has been formed in substantial part in accordance with an aspect of the present invention. The memory cell structure initially comprises a substrate layer 110 such as a copper substrate having copper sulfide ($Cu_xS_y$) regions 120 formed thereon. The copper sulfide regions 120 can be obtained by employing lithography such as photolithography to selectively remove portions of a copper sulfide layer.

Alternatively or in addition, the copper sulfide regions 120 can be converted from particular areas on the copper substrate. This can be performed in a chamber suitable to yield desired portions of copper sulfide. It should be appreciated that the copper sulfide layer can be formed by any suitable methodology so as to not cause damage to the underlying copper substrate layer 110. This is because portions of the copper substrate 110 can subsequently be employed to form one or more copper connection contacts.

The copper sulfide portions 120 can be employed to generate a conducting polymer material. More specifically, in a chamber used to grow a conducting polymer 130 from a gas-phase monomer, the copper sulfide regions 120 can be exposed through distinct openings of a mask to radiation in the presence of oxygen ($O_2$). The conducting polymer 130 can be grown on the portions of copper sulfide 120 that are exposed to the radiation. However, the masked portions of the structure 100 are not substantially affected. Hence, polymer material 130 does not substantially grow in the non-irradiated portions.

Though not demonstrated in FIG. 1, it should be appreciated that the structure 100 can include one or more other layers or features such as, but not limited to, insulating and/or dielectric layers, plugs, metal and non-metal layers—any of which can be located above the copper sulfide and/or conducting polymer regions and/or below the copper substrate 110 to form a desired memory cell structure according to a user's desired application.

Fabrication of the memory cell structure 100 and formation of the conducting polymer in particular, are described in substantial part below in FIGS. 2-11.

Figure 2:
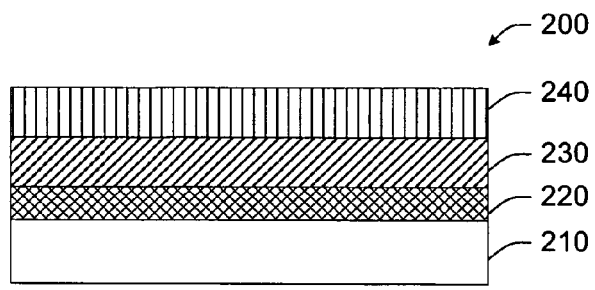
FIG. 2 illustrates a cross-sectional view of a partially fabricated, exemplary polymer memory device formed in accordance with an aspect of the present invention.

FIG. 2 illustrates a cross-sectional view of a partially formed memory cell structure 200. At this early or intermediate stage of fabrication, the memory cell structure 200 comprises a copper substrate 210 as well as an amorphous carbon layer 220 formed thereover as shown. Next, an inorganic dielectric anti-reflective layer (ARC) 230 can be formed on the amorphous carbon layer 220. One example of such an ARC layer 230 is silicon oxynitride (SiON). Other materials that are suitable to carry out the operations of the ARC layer can be employed as well.

Following, a photoresist layer 240 can be deposited or spin-coated over the inorganic dielectric layer 230 to facilitate selective etching of the inorganic dielectric layer 230 in connection with obtaining the desired memory cell structure. The photoresist layer 240 can be of any suitable material that allows selective removal of one or more portions of the inorganic dielectric layer 230 at desired locations of the inorganic dielectric layer 230. The photoresist layer 240 may be a positive or negative resist such that when areas of the photoresist layer 240 are irradiated, either the irradiated or non-irradiated portions, respectively, undergo a chemical change to allow removal of those portions. Removal may be accomplished in part by applying or rinsing the structure 100 or photoresist 240, in particular, with an appropriate developer. The developer can be chosen according to the type of photoresist layer 240 as well as the type of material underlying the photoresist 240. In this instance, a negative photoresist is utilized; however a positive photoresist can be used as well.

Figure 3:
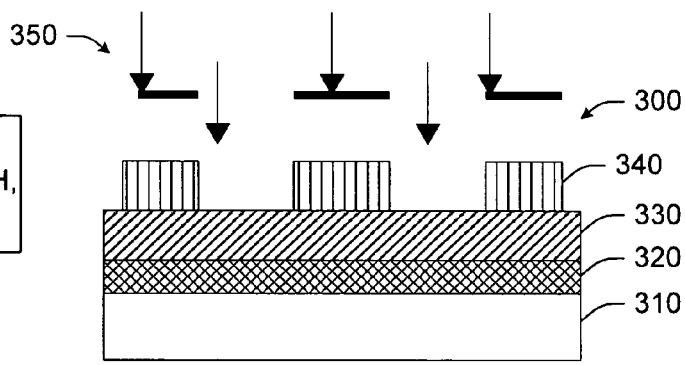
FIG. 3 illustrates a cross-sectional view of a partially fabricated, exemplary polymer memory device formed in accordance with an aspect of the present invention.

FIG. 3 represents the structure 200 of FIG. 2 after a subsequent phase of processing has occurred in accordance with an aspect of the present invention. In particular, memory cell structure 300 is being selectively irradiated as indicated by the arrows 350 through a mask at an appropriate wavelength to cause selective removal of particular portions of the photoresist (FIG. 2, 240). The underlying inorganic dielectric layer 330 is not substantially affected by the exposure process. Following exposure, the structure can be baked and developed. Portions 340 of the photoresist layer remain; meanwhile other surface portions of the underlying inorganic dielectric ARC layer 330 are exposed.

Figure 4:
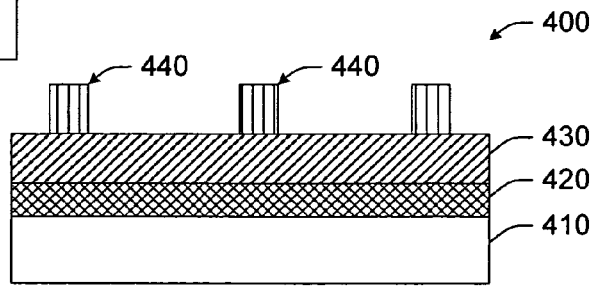
FIG. 4 illustrates a cross-sectional view of a partially fabricated, exemplary polymer memory device formed in accordance with an aspect of the present invention.

FIG. 4 depicts a resulting structure 400 after photoresist portions 440 have been trimmed to a desired dimension. The underlying inorganic dielectric layer 430, amorphous carbon layer 420 and copper substrate 410 remain unaffected at this stage. As can be seen from the trimming process, the portions of photoresist material have decreased in size or width, thereby exposing a large area of the inorganic dielectric ARC layer 430.

Figure 5:
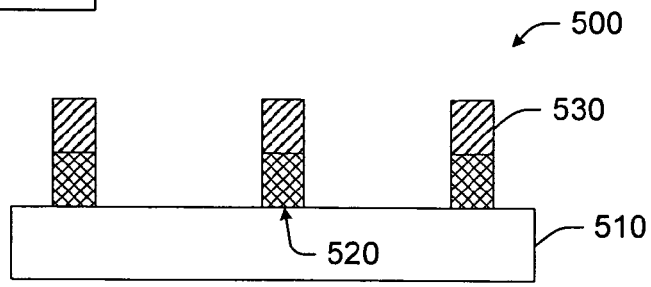
FIG. 5 illustrates a cross-sectional view of a partially fabricated, exemplary polymer memory device formed in accordance with an aspect of the present invention.

Referring now to FIG. 5, there is illustrated a partially fabricated memory cell structure 500 in which a patterned inorganic dielectric ARC layer 530 has been formed and then employed as a hardmask to etch an underlying amorphous carbon 520 layer. As a result, top portions of a copper substrate 510 can be exposed. It should be appreciated that the photoresist layer (FIG. 4, 440) can be substantially removed prior to etching the amorphous carbon layer 520 (FIG. 4, 420).

Figure 6:
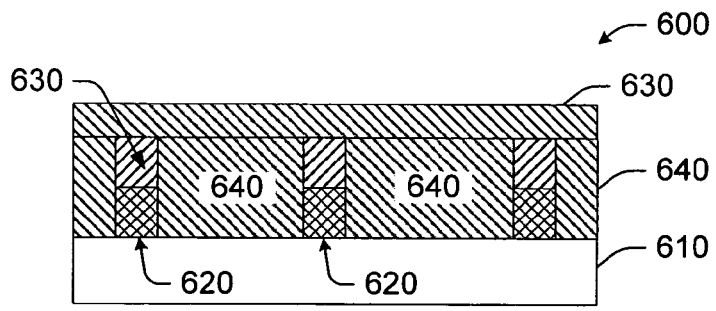
FIG. 6 illustrates a cross-sectional view of a partially fabricated, exemplary polymer memory device formed in accordance with an aspect of the present invention.

Moving on to FIG. 6, the structure 600 demonstrates that a dielectric layer 640 has been conformally deposited over the structure 600 to cover or insulate the three exposed sides of the ARC 630 as well as both exposed sides of the amorphous carbon 620. The dielectric layer 640 can be a low temperature or organic low-k dielectric material such as BLOK or SiLK to facilitate planarizing the underlying structures.

Figure 7:
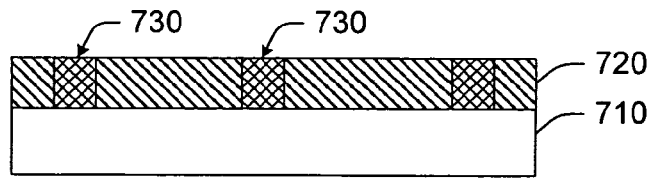
FIG. 7 illustrates a cross-sectional view of a partially fabricated, exemplary polymer memory device formed in accordance with an aspect of the present invention.

Turning now to FIG. 7, there is illustrated a cross-sectional view of a partially-formed memory cell structure 700. In particular, the structure 700 comprises a copper substrate 710 and dielectric material 720 thereover and surrounding patterned amorphous carbon regions 730 located thereon. As can be seen, any remaining dielectric material (FIG. 6, 640) has been polished away to yield a relatively planar surface along the structure 700.

Figure 8:
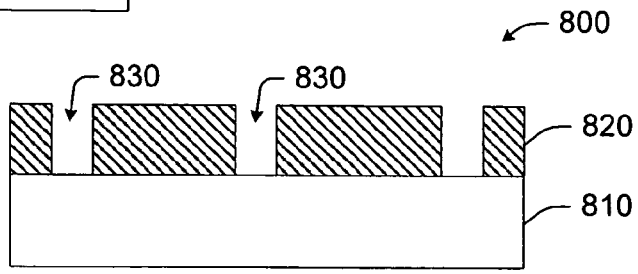
FIG. 8 illustrates a cross-sectional view of a partially fabricated, exemplary polymer memory device formed in accordance with an aspect of the present invention.

In FIG. 8, structure 800 indicates that the amorphous carbon (FIG. 7, 730) has been substantially removed in oxygen ($O_2$) plasma ash. Dielectric (ARC) material 820 is not substantially affected by the removal process. Moreover, portions 830 of an underlying copper substrate 810 can be exposed as a result of removing the amorphous carbon material.

Figure 9:
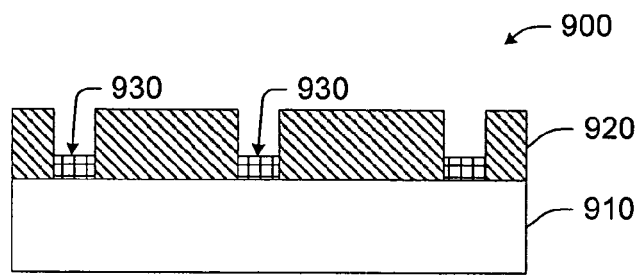
FIG. 9 illustrates a cross-sectional view of a partially fabricated, exemplary polymer memory device formed in accordance with an aspect of the present invention.
Figure 10:
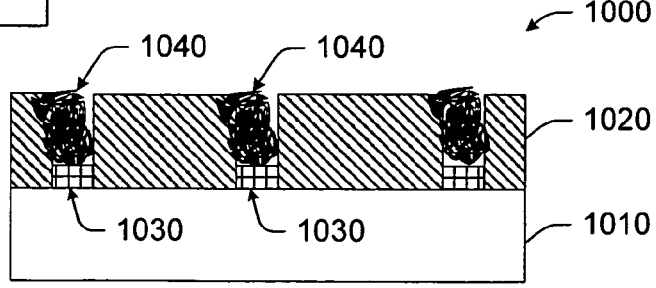
FIG. 10 illustrates a cross-sectional view of a partially fabricated, exemplary polymer memory device formed in accordance with an aspect of the present invention.

FIG. 9 demonstrates a deposition of $Cu_xS_y$ (copper sulfide) 930 in exposed portions of the copper substrate. The deposition of the copper sulfide material can result from a reaction between $H_2S$ and exposed areas of the copper substrate 910 surface. With the presence of copper sulfide material, conducting polymer can be grown on the copper sulfide surface from a vapor phase monomer. This is illustrated in FIG. 10. FIG. 10 demonstrates conducting polymer growth 1040 on the surfaces of the exposed copper sulfide material 1030—insulated by a low temperature or an organic low-k dielectric material 1020.

Figure 11:
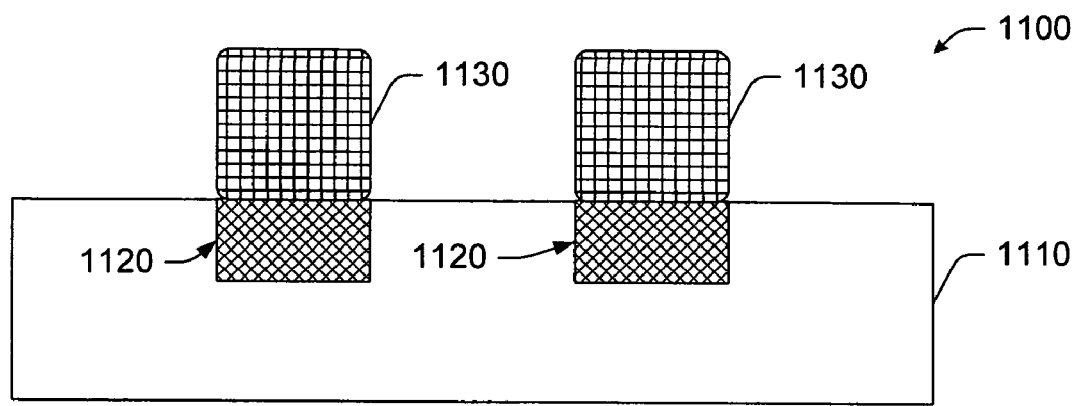
FIG. 11 illustrates a cross-sectional view of an alternative partially fabricated polymer memory device formed in accordance with an aspect of the present invention.
Figure 12:
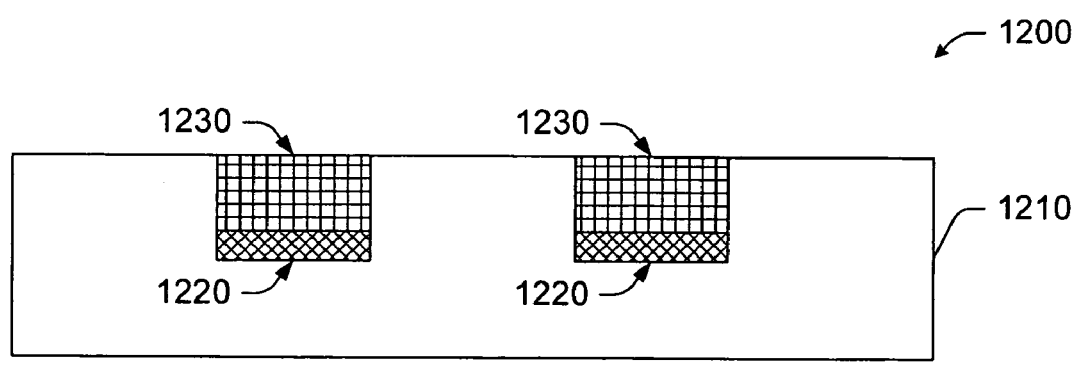
FIG. 12 illustrates a cross-sectional view of an alternative partially fabricated polymer memory device formed in accordance with an aspect of the present invention.

FIGS. 11 and 12 represent memory cell structures 1100 and 1200, respectively, which illustrate alternative locations for formation or growth of the conducting polymer material. For example, in FIG. 11, in a partially fabricated memory cell structure 1100, vias filled with copper sulfide material 1120 can be formed within a copper substrate 1110 as shown. Following therefrom, conducting polymer material 1130 can be grown from the copper sulfide 1120 to a desirable thickness. As can be seen, the copper sulfide 1120 substantially fills the vias. Alternatively, vias formed within a copper substrate 1210 can be partially filled with copper sulfide material 1220 that is sufficient to promote or facilitate conducting polymer growth. Thus, the conducting polymer material 1230 can be grown to fill at least a portion of the via and may extend therefrom if desired.

Figure 13:
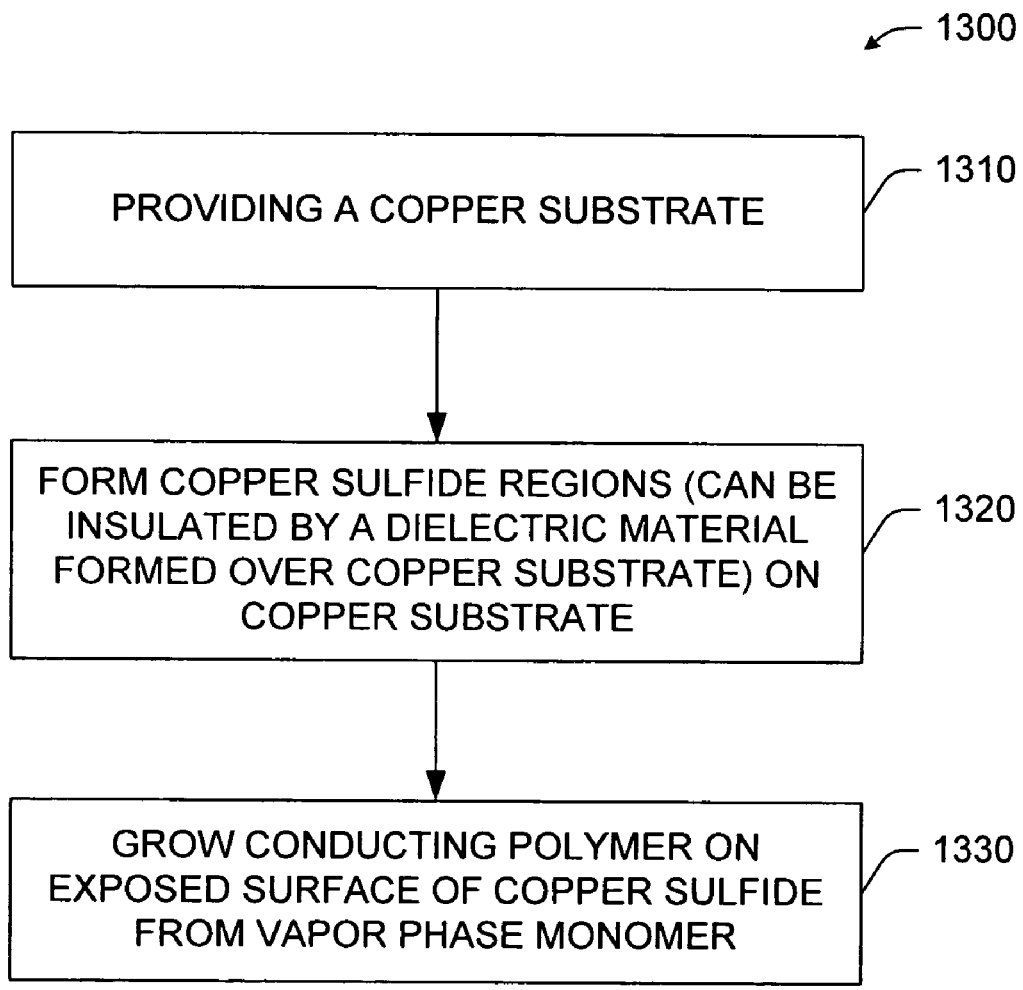
FIG. 13 illustrates a flow diagram of an exemplary method of forming a conducting polymer as derived from copper-containing material in accordance with an aspect of the present invention.

Referring now to FIG. 13, a flow diagram of an exemplary method 1300 for fabricating a memory cell structure is demonstrated in accordance with an aspect of the present invention. The method 1300 involves providing a copper substrate at 1310. The copper substrate may be provided in the form of a bit line and/or copper pad produced by any one of a single and dual damascene process, for example.

Subsequently, at 1320, copper sulfide regions are formed atop the copper substrate. The copper sulfide regions can be insulated by a dielectric material such as a low temperature or organic low-k dielectric material. At 1330, the copper sulfide can operate at least in part as a catalyst in order to facilitate selective conducting polymer growth, for example.

Conducting polymer growth can also take place in a via formed within the copper substrate. For example, imagine that one or more vias are created in the copper substrate. Following, copper sulfide material can be conformally deposited therein such as by chemical vapor deposition. Copper sulfide material can be selectively removed from top-side surfaces of the copper substrate as desired such that the copper sulfide material substantially remains in a lower portion of the via (e.g., copper sulfide partially fills the via). However, any other areas on the surface of the copper substrate are substantially free of copper sulfide, depending on the desired application of the cell structure.

The present copper sulfide material can then be employed as a catalyst to selectively grow a conducting polymer material. This can be accomplished in part by exposing the desired regions of copper sulfide material to radiation of an appropriate wavelength or range of wavelengths in the presence of oxygen. Thus, the conducting polymer material can be grown within one or more vias as desired and/or depending on the desired final memory cell structure.

Though not explicitly described, it should be appreciated that multiple polymer memory devices in a plurality of vias may be formed in a memory cell structure. Furthermore, such via formation may be selective and accomplished in part by using one or more masks suitable to create the desired via pattern.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of fabricating a memory cell structure comprising:
   providing a copper substrate;
   forming one or more copper sulfide regions on the copper substrate;
   exposing the one or more copper sulfide regions by way of a vapor phase monomer to facilitate growing a conducting polymer material on surfaces of the copper sulfide regions; and
   forming at least one of plugs, shallow trench isolation regions, and channel stop regions below the conducting polymer material.

2. The method of claim 1, further comprising:
   forming an amorphous carbon layer over the copper substrate before forming the one or more copper sulfide regions;
   forming an antireflective layer over the amorphous carbon layer; forming one or more photoresist structures on the antireflective layer;
   selectively etching the antireflective layer using the one or more photoresist structures; and
   selectively etching the amorphous carbon layer using the patterned antireflective layer as a hardmask.

3. The method of claim 2, further comprising:
   depositing a dielectric material to facilitate planarizing underlying structures;
   removing the antireflective layer; and exposing one or more surfaces of the copper substrate by removing amorphous carbon in $O_2$ plasma ash to facilitate subsequent formation of copper sulfide regions.

4. The method of claim 3, wherein the underlying structures comprises a hardmask region overlying an amorphous carbon region.

5. The method of claim 3, wherein the dielectric material comprises at least one of a low temperature dielectric or an organic low-k dielectric.

6. The method of claim 1, further comprising forming one or more layers overlying the copper sulfide or conducting polymer material.

7. The method of claim 6, wherein the one or more layers comprises a dielectric layer that includes at least one of oxide, nitride, TEOS, FTEOS, and organic materials.

8. The method of claim 6, wherein the one or more layers comprises tungsten, titanium, tantalum, titanium nitride, amorphous carbon, aluminum, indium-tin oxide, platinum, zinc, nickel, iron, manganese, magnesium, gold, chromium, metal silicides, alloys thereof, and/or any combination thereof.

9. The method of claim 8, wherein alloys comprise nickel-containing alloys, brass, stainless steel, magnesium-silver alloy, and/or combinations thereof.

10. The method of claim 8, wherein the one or more layers comprise a word line, a barrier layer, a metal-containing layer, and an insulating layer.

11. The method of claim 1, wherein the conducting polymer material comprises any one of polyphenol acetylene, poly-acetylene, poly-diphenyl acetylene, polyaniline, polythiophene, polyporphyrins, porphyrinic macrocycles, thiol derivatized polyporphyrins, polymetallocenes, polyferrocenes, polyphthalocyanines, polyvinylenes, polypyrroles, and poly-(p-phenylene vinylene, and/or combinations thereof, and/or monomers thereof.

12. The method of claim 1, further comprising forming channel stop regions below the conducting polymer material.

13. The method of claim 1, wherein exposing the one or more copper sulfide regions by way of a vapor phase monomer comprises reacting $H_2S$ with an exposed surface of the copper substrate.

14. A method of fabricating a memory cell structure comprising:
providing a semiconductor substrate;
forming a copper layer overlying the semiconductor substrate;
forming one or more vias in the copper layer;
forming copper sulfide material in a bottom portion of the one or more vias in the copper layer, whereby the copper sulfide contacts a surface of the copper layer and reacts with $H_2S$; and
growing a conducting polymer material on exposed copper sulfide surface from a vapor phase monomer.

15. The method of claim 14, further comprising forming one or more layers overlying the copper sulfide or conducting polymer material.

16. The method of claim 15, wherein the one or more layers comprises a dielectric layer that includes at least one of oxide, nitride, TEOS, FTEOS, and organic materials.

17. The method of claim 14, wherein the conducting polymer material comprises any one of polyphenol acetylene, poly-acetylene, poly-diphenyl acetylene, polyaniline, polythiophene, polyporphyrins, porphyrinic macrocycles, thiol derivatized polyporphyrins, poly-metallocenes, polyferrocenes, polyphthalocyanines, polyvinylenes, polypyrroles, and poly-(p-phenylene vinylene, and/or combinations thereof, and/or monomers thereof.

18. The method of claim 14, wherein the one or more layers comprises tungsten, titanium, tantalum, titanium nitride, amorphous carbon, aluminum, indium-tin oxide, platinum, zinc, nickel, iron, manganese, magnesium, gold, chromium, metal silicides, alloys thereof, and/or any combination thereof.

19. The method of claim 18, wherein alloys comprise nickel-containing alloys, brass, stainless steel, magnesium-silver alloy, and/or combinations thereof.

20. A system for fabricating a memory cell structure comprising:
means for providing a copper substrate;
means for forming one or more copper sulfide regions on the copper substrate; and
means for exposing the one or more copper sulfide regions with a vapor phase monomer to facilitate growing a conducting polymer material on surfaces of the copper sulfide regions;
means for forming an amorphous carbon layer over the copper substrate before
means for forming the one or more copper sulfide regions;
means for forming an antireflective layer over the amorphous carbon layer; forming one or more photoresist structures on the antireflective layer;
means for selectively etching the antireflective layer using the one or more photoresist structures; and
means for selectively etching the amorphous carbon layer using the patterned antireflective layer as a hardmask.

* * * * *